(12) United States Patent
Nakano et al.

(10) Patent No.: US 8,916,858 B2
(45) Date of Patent: Dec. 23, 2014

(54) DISPLAY DEVICE

(71) Applicants: Shintaro Nakano, Kanagawa-ken (JP); Tomomasa Ueda, Kanagawa-ken (JP); Kentaro Miura, Kanagawa-ken (JP); Nobuyoshi Saito, Tokyo (JP); Tatsunori Sakano, Tokyo (JP); Hajime Yamaguchi, Kanagawa-ken (JP)

(72) Inventors: Shintaro Nakano, Kanagawa-ken (JP); Tomomasa Ueda, Kanagawa-ken (JP); Kentaro Miura, Kanagawa-ken (JP); Nobuyoshi Saito, Tokyo (JP); Tatsunori Sakano, Tokyo (JP); Hajime Yamaguchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 43 days.

(21) Appl. No.: 13/729,495

(22) Filed: Dec. 28, 2012

(65) Prior Publication Data
US 2013/0313547 A1 Nov. 28, 2013

(30) Foreign Application Priority Data
May 22, 2012 (JP) .................................. 2012-116835

(51) Int. Cl.
*H01L 51/52* (2006.01)
*H01L 33/44* (2010.01)
*H01L 27/32* (2006.01)
*H01L 27/12* (2006.01)

(52) U.S. Cl.
CPC ........ *H01L 51/5203* (2013.01); *H01L 51/5253* (2013.01); *H01L 51/5256* (2013.01); *H01L 27/3262* (2013.01); *H01L 27/1248* (2013.01)
USPC .................................. 257/40; 257/43; 257/98

(58) Field of Classification Search
USPC ........................................................ 257/43, 98
See application file for complete search history.

(56) References Cited

U.S. PATENT DOCUMENTS

| | | | | |
|---|---|---|---|---|
| 6,111,361 | A * | 8/2000 | Xu et al. ..................... | 315/169.1 |
| 6,980,262 | B2 * | 12/2005 | Song ............................ | 349/39 |
| 7,145,174 | B2 * | 12/2006 | Chiang et al. ................. | 257/59 |
| 7,675,078 | B2 * | 3/2010 | Wang et al. .................... | 257/98 |
| 7,875,895 | B2 * | 1/2011 | Kwack et al. .................. | 257/98 |

(Continued)

FOREIGN PATENT DOCUMENTS

| | | |
|---|---|---|
| JP | 9-36369 A | 2/1997 |
| JP | 2001-284042 A | 10/2001 |

(Continued)

OTHER PUBLICATIONS

Office Action issued Feb. 19, 2014 in Korean Patent Application No. 10-2013-0022093 (with English language translation).

(Continued)

*Primary Examiner* — Earl Taylor
(74) *Attorney, Agent, or Firm* — Oblon, Spivak, McClelland, Maier & Neustadt, L.L.P.

(57) ABSTRACT

According to one embodiment, a display device includes a substrate, a thin film transistor, a pixel electrode, an organic light emitting layer, a common electrode, and a sealing unit. The thin film transistor is provided on the substrate. The thin film transistor includes a gate electrode, a gate insulating film, a semiconductor film, a first conducting portion, and a second conducting portion. The pixel electrode is electrically connected to one of the first conducting portion and the second conducting portion. The organic light emitting layer is provided on the pixel electrode. The common electrode is provided on the organic light emitting layer. The sealing unit is provided on the common electrode. The sealing unit includes a first sealing film and a second sealing film. A refractive index of the second sealing film is different from a refractive index of the first sealing film.

19 Claims, 10 Drawing Sheets

(56) References Cited

U.S. PATENT DOCUMENTS

| | | | |
|---|---|---|---|
| 7,897,968 B2* | 3/2011 | Kuwabara et al. | 257/57 |
| 7,932,533 B2* | 4/2011 | Wang et al. | 257/98 |
| 8,089,066 B2* | 1/2012 | Yamazaki et al. | 257/40 |
| 8,362,693 B2* | 1/2013 | Yamazaki et al. | 313/504 |
| 8,456,084 B2* | 6/2013 | Yamazaki et al. | 313/512 |
| 8,642,999 B2* | 2/2014 | Shioya et al. | 257/40 |
| 2003/0129790 A1* | 7/2003 | Yamazaki et al. | 438/149 |
| 2005/0199959 A1* | 9/2005 | Chiang et al. | 257/368 |
| 2007/0018163 A1* | 1/2007 | Chiang et al. | 257/59 |
| 2007/0057251 A1* | 3/2007 | Wang et al. | 257/40 |
| 2008/0055831 A1* | 3/2008 | Satoh | 361/681 |
| 2008/0296600 A1* | 12/2008 | Kwack et al. | 257/98 |
| 2009/0061721 A1* | 3/2009 | Isa | 445/24 |
| 2009/0114910 A1* | 5/2009 | Chang | 257/43 |
| 2009/0189153 A1* | 7/2009 | Iwasaki et al. | 257/43 |
| 2010/0090208 A1* | 4/2010 | Moon et al. | 257/40 |
| 2010/0102314 A1* | 4/2010 | Miyairi et al. | 257/43 |
| 2010/0117529 A1* | 5/2010 | Wang et al. | 313/505 |
| 2010/0133521 A1* | 6/2010 | Shioya et al. | 257/40 |
| 2010/0231840 A1* | 9/2010 | Saida et al. | 349/153 |
| 2010/0283056 A1* | 11/2010 | Yasumatsu | 257/59 |
| 2011/0088770 A1* | 4/2011 | Allemand et al. | 136/256 |
| 2012/0050145 A1* | 3/2012 | Yasumatsu | 345/80 |
| 2012/0091450 A1* | 4/2012 | Kamatani et al. | 257/40 |
| 2012/0097994 A1* | 4/2012 | Yamazaki et al. | 257/88 |
| 2012/0168736 A1* | 7/2012 | Doi et al. | 257/40 |
| 2012/0262660 A1* | 10/2012 | Fujiwara et al. | 349/158 |
| 2013/0001543 A1* | 1/2013 | Kamatani et al. | 257/40 |
| 2013/0056722 A1* | 3/2013 | Nishide et al. | 257/40 |
| 2013/0292662 A1* | 11/2013 | Hashimoto et al. | 257/40 |
| 2013/0299814 A1* | 11/2013 | Miyashita et al. | 257/40 |
| 2013/0300638 A1* | 11/2013 | Kamatani et al. | 345/76 |

FOREIGN PATENT DOCUMENTS

| | | | | |
|---|---|---|---|---|
| JP | 2001-338754 A | | 12/2001 | |
| JP | 2004-47410 A | | 2/2004 | |
| JP | 2004-103957 | | 4/2004 | |
| JP | 2005222778 A | * | 8/2005 | H05B 33/04 |
| JP | 2006-4917 A | | 1/2006 | |
| JP | 2008-4362 A | | 1/2008 | |
| JP | 2008-305557 A | | 12/2008 | |
| JP | 2010-30295 | | 2/2010 | |
| JP | 2010-50173 A | | 3/2010 | |
| JP | 2013156281 A | * | 8/2013 | |
| KR | 10-2004-0062190 A | | 7/2004 | |
| KR | 10-2008-0105308 A | | 12/2008 | |

OTHER PUBLICATIONS

Japanese Office Action issued Jul. 16, 2014 in Patent Application No. 2012-116835 with English Translation.

* cited by examiner

DISPLAY DEVICE

CROSS-REFERENCE TO RELATED APPLICATIONS

This application is based upon and claims the benefit of priority from the prior Japanese Patent Application No. 2012-116835, filed on May 22, 2012; the entire contents of which are incorporated herein by reference.

FIELD

Embodiments described herein relate generally to a display device.

BACKGROUND

There is an active matrix display device in which a switching element such as a thin film transistor controls a current passing through an organic EL (Electro-Luminescent) device. It is desired to improve image quality in this display device.

DETAILED DESCRIPTION

Figure 1:
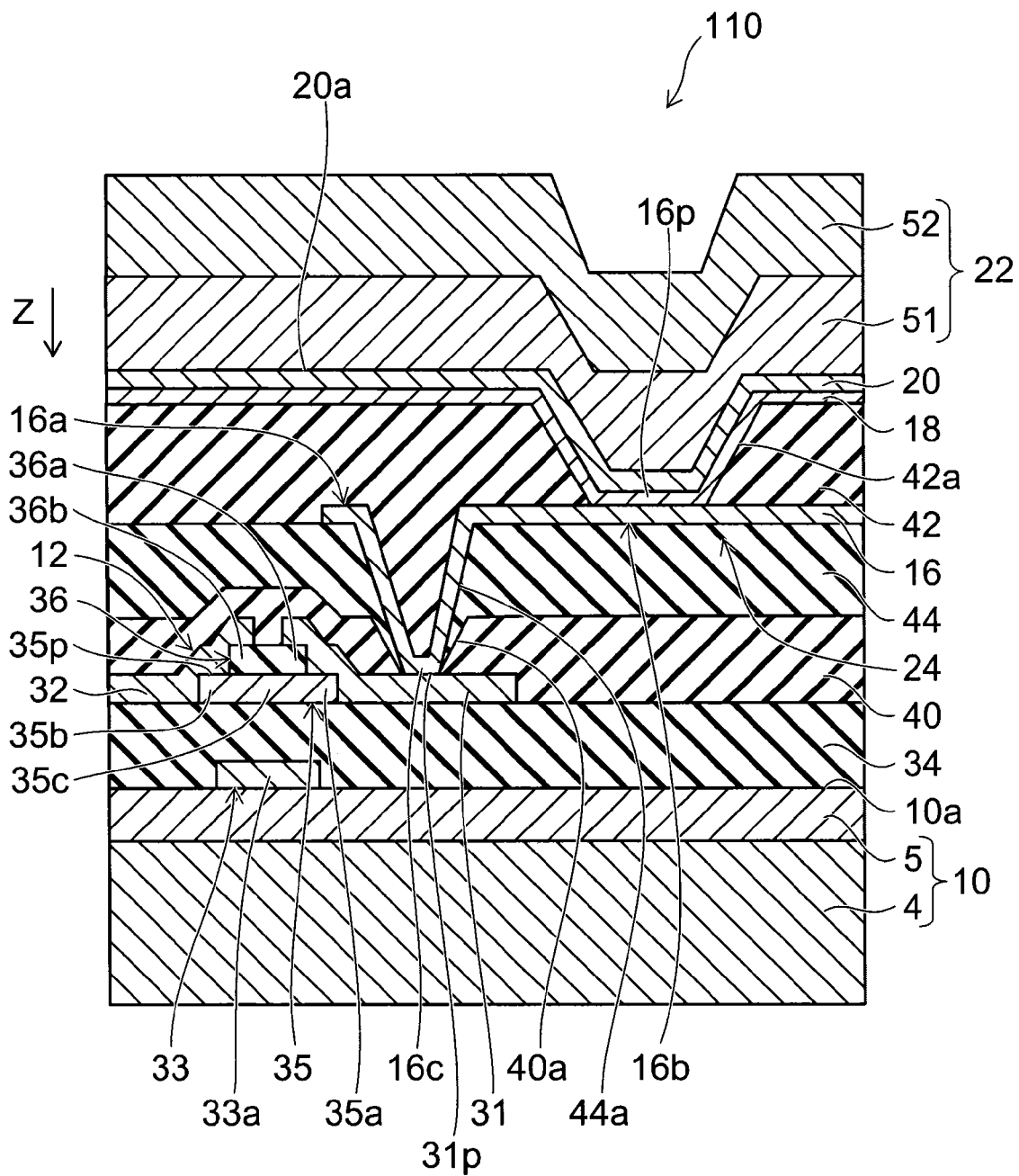
FIG. 1 is a schematic cross-sectional view illustrating the configuration of a display device according to a first embodiment.

According to one embodiment, a display device includes a substrate, a thin film transistor, a pixel electrode, an organic light emitting layer, a common electrode, and a sealing unit. The thin film transistor is provided on the substrate. The thin film transistor includes a gate electrode, a gate insulating film, a semiconductor film, a first conducting portion, and a second conducting portion. The gate electrode is provided on the substrate. The gate insulating film is provided on the gate electrode. The semiconductor film is provided on the gate insulating film. The first conducting portion is electrically connected to the semiconductor film. The second conducting portion is electrically connected to the semiconductor film. The second conducting portion is provided apart from the first conducting portion. The pixel electrode is electrically connected to one of the first conducting portion and the second conducting portion. The organic light emitting layer is provided on the pixel electrode. The common electrode is provided on the organic light emitting layer. The sealing unit is provided on the common electrode. The sealing unit includes a first sealing film and a second sealing film. The first sealing film has a hydrogen concentration of $10^{20}$ atoms/cm$^3$ or less. The second sealing film is stacked on the first sealing film. The second sealing film has a hydrogen concentration of $10^{20}$ atoms/cm$^3$ or less. A refractive index of the second sealing film is different from a refractive index of the first sealing film.

Various embodiments will be described hereinafter with reference to the accompanying drawings.

It is noted that the drawings are schematic or conceptual. The relationship between the thicknesses and widths of portions, a ratio of size between portions, or the like are not necessarily the same as real ones. Moreover, even in the case of expressing the same portions, dimensions and ratios between the portions are sometimes expressed differently depending on the drawings.

In the specification and drawings, components similar to those described or illustrated in a drawing thereinabove are marked with the identical reference numerals, and a detailed description is omitted as appropriate.

First Embodiment

FIG. 1 is a schematic cross-sectional view illustrating the configuration of a display device according to a first embodiment.

As shown in FIG. 1, a display device 110 according to the embodiment includes a substrate 10, a thin film transistor 12, a pixel electrode 16, an organic light emitting layer 18, a common electrode 20, and a sealing unit 22.

The pixel electrode 16, the organic light emitting layer 18, and the common electrode 20 form an organic EL light emitting element portion 24. The light emitting element portion 24 is controlled and driven by the thin film transistor 12. In the display device 110, the combinations of the switching elements 12 and the light emitting element portions 24 are disposed in a matrix configuration. The drive of the switching elements 12 and the light emission of the light emitting element portions 24 in association with the drive are controlled to display pictures. The display device 110 is an active matrix display device using an organic EL device.

The substrate 10 has a major surface 10a. The substrate 10 includes a main body portion 4 and a barrier layer 5. A light transmissive material, for example, is used for the main body portion 4. A glass material or a resin material, for example, is used for the main body portion 4. A light transmissive and flexible material can be used for the main body portion 4. A resin material such as polyimide, for example, is used for the main body portion 4. The barrier layer 5 suppresses the penetration of impurities and moisture through the main body portion 4, for example, and protects the thin film transistor 12 and the light emitting element portion 24 provided on the substrate 10. A light transmissive and flexible material, for example, is used for the barrier layer 5.

The thin film transistor 12 is provided on the major surface 10a of the substrate 10.

The thin film transistor 12 includes a first conducting portion 31, a second conducting portion 32, a gate electrode 33, a gate insulating film 34, a semiconductor film 35, and a channel protection film 36.

The gate electrode 33 is provided on the major surface 10a of the substrate 10. A high melting point metal such as molybdenum tungsten (MoW), molybdenum tantalum (MoTa), and tungsten (W), for example, is used for the gate electrode 33.

The gate insulating film 34 is provided on the gate electrode 33. In this example, the gate insulating film 34 is provided on throughout the major surface 10a so as to cover the gate electrode 33. An insulative and light transmissive material, for example, is used for the gate insulating film 34. One of a silicon oxide film, a silicon nitride film, and a silicon oxynitride film, for example, is used for the gate insulating film 34.

The semiconductor film 35 is provided on the gate insulating film 34. The gate insulating film 34 is provided between the gate electrode 33 and the semiconductor film 35, and insulates the gate electrode 33 from the semiconductor film 35. An amorphous oxide semiconductor containing at least one of In, Ga, and Zn, for example, is used for the semiconductor film 35. Namely, one of an In—Ga—Zn—O oxide semiconductor, an In—Ga—O oxide semiconductor, and an In—Zn—O oxide semiconductor, for example, is used for the semiconductor film 35. The thickness of the semiconductor film 35 (a distance along a Z-axis direction) is about 30 nm. Thereby, the electric characteristics of the semiconductor film 35 can be improved, for example. More specifically, the thickness of the semiconductor film 35 is 5 nm or more and 50 nm or less, for example.

In the semiconductor film 35 including an amorphous oxide semiconductor, a diffraction pattern or the like showing crystallinity is not observed even though the semiconductor film 35 is observed using a transmission electron microscope (TEM) or X-ray diffraction (XRD) topography, for example. The film and shape of the semiconductor film 35 can be observed using a scanning electron microscope (SEM), TEM, or the like.

For the semiconductor film 35, such a material may be used that the microcrystals of the oxide semiconductor are dispersed in the amorphous oxide semiconductor described above.

The first conducting portion 31 is provided on the gate insulating film 34. A part of the first conducting portion 31 is provided on the semiconductor film 35, and contacts the semiconductor film 35. Thus, the first conducting portion 31 is electrically connected to the semiconductor film 35. The second conducting portion 32 is provided on the gate insulating film 34. The second conducting portion 32 is disposed apart from the first conducting portion 31. A part of the second conducting portion 32 is provided on the semiconductor film 35, and contacts the semiconductor film 35. Thus, the second conducting portion 32 is electrically connected to the semiconductor film 35. Ti, Al, Mo, and the like, for example, are used for the first conducting portion 31 and the second conducting portion 32. The first conducting portion 31 and the second conducting portion 32 may be a stacked body containing at least one of Ti, Al, and Mo, for example. The first conducting portion 31 is one of the source electrode and drain electrode of the thin film transistor 12. The second conducting portion 32 is the other of the source electrode and drain electrode of the thin film transistor 12.

The channel protection film 36 is provided on the semiconductor film 35. The channel protection film 36 protects the semiconductor film 35. A silicon oxide film, for example, is used for the channel protection film 36.

The first conducting portion 31 covers a first portion 36a of the channel protection film 36. The second conducting portion 32 covers a second portion 36b of the channel protection film 36. The first conducting portion 31 covers a first region 35a of the semiconductor film 35. The second conducting portion 32 covers a second region 35b of the semiconductor film 35. The semiconductor film 35 has a third region 35c that is not covered with the first conducting portion 31 and the second conducting portion 32. The gate electrode 33 has a portion 33a between the first conducting portion 31 and the second conducting portion 32 when seen in a direction vertical to a film surface 35p of the semiconductor film 35 (hereinafter, referred to as the Z-axis direction). Namely, the gate electrode 33 opposes the third region 35c of the semiconductor film 35 with the gate insulating film 34 sandwiched between the gate electrode 33 and the third region 35c. The channel protection film 36 is provided at least on the third region 35c. Thus, a voltage is applied to the gate electrode 33 to generate a channel through the semiconductor film 35, and a current passes across the first conducting portion 31 and the second conducting portion 32.

A passivation film 40 is provided between the thin film transistor 12 and the pixel electrode 16. An insulative and light transmissive material, for example, is used for the passivation film 40. One of a silicon oxide film, a silicon nitride film, and a silicon oxynitride film, for example, is used for the passivation film 40.

In this example, a color filter 44 is provided between the pixel electrode 16 and the passivation film 40. The color filter 44 has a different color for every pixel. The transmittance of the color filter 44 is varied depending on wavelengths. For example, one of red, green, and blue color resin films (a color resist, for example) is used for the color filter 44. The color filter 44 is provided as necessary. The color filter 44 can be omitted.

The pixel electrode 16 is electrically connected to one of the first conducting portion 31 and the second conducting portion 32. In this example, the pixel electrode 16 is electrically connected to the first conducting portion 31 (a source, for example).

The pixel electrode 16 is provided on the color filter 44. The pixel electrode 16 has an opposing region 16a opposing the thin film transistor 12 and a non-opposing region 16b not opposing the thin film transistor 12 in the Z-axis direction. An electrically conductive and light transmissive material, for example, is used for the pixel electrode 16. ITO (Indium Tin Oxide) or the like, for example, is used for the pixel electrode 16. A metal oxide such as ITO, IZO (In—Zn—O), AZO (Al—Zn—O), IGZO (In—Ga—Zn—O), and ZnO, for example, is used for the pixel electrode 16. The pixel electrode 16 is also referred to as a pixel electrode, for example.

The passivation film 40 and the color filter 44 are provided with an opening 40a (a first opening) and an opening 44a, respectively, and a part 31p of the first conducting portion 31 is exposed from the opening 40a and the opening 44a. A part 16c of the opposing region 16a of the pixel electrode 16 contacts the part 31p of the first conducting portion 31 in the opening 40a and the opening 44a. Thus, the pixel electrode 16 is electrically connected to the first conducting portion 31.

A planarization film 42 is provided on the pixel electrode 16 and the color filter 44. An insulative material, for example, is used for the planarization film 42. An organic resin material, for example, is used for the planarization film 42. The planarization film 42 is provided with an opening 42a (a second opening). A part 16p of the non-opposing region 16b of the pixel electrode 16 is exposed from the opening 42a.

The organic light emitting layer 18 is provided on the planarization film 42. The organic light emitting layer 18 contacts the part 16p of the non-opposing region 16b of the pixel electrode 16 in the opening 42a. The planarization film 42 prevents the opposing region 16a from contacting the organic light emitting layer 18. A stacked body having a hole transport layer, a light emitting layer, and an electron transport layer stacked on each other, for example, is used for the organic light emitting layer 18.

The common electrode 20 is provided on the organic light emitting layer 18. The common electrode 20 has a portion 20a extending on the semiconductor film 35. A conductive material is used for the common electrode 20. A metal material such as Al and MgAg, for example, is used for the common electrode 20. The thickness of the common electrode 20 is 200 nm, for example, (100 nm or more and 300 nm or less, for example).

The light emitting element portion 24 is formed in the non-opposing region 16b, for example. In the light emitting element portion 24, a voltage is applied across the pixel electrode 16 and the common electrode 20 to emit light from the organic light emitting layer 18. The light emitted from the organic light emitting layer 18 passes through the color filter 44, the passivation film 40, the gate insulating film 34, and the substrate 10, and goes to the outside. The display device 110 is a lower surface emitting display device.

The sealing unit 22 is provided on the common electrode 20. The sealing unit 22 includes a first sealing film 51 and a second sealing film 52. The first sealing film 51 is provided on the common electrode 20. The second sealing film 52 is stacked on the first sealing film 51. In this example, the second sealing film 52 is provided on the first sealing film 51. In the sealing unit 22, the organic light emitting layer 18 and the common electrode 20 is covered with the first sealing film 51 and the second sealing film 52. The sealing unit 22 protects the organic light emitting layer 18 and the common electrode 20. The hydrogen concentration of the first sealing film 51 is $10^{20}$ atoms/cm$^3$ or less. The hydrogen concentration of the second sealing film 52 is $10^{20}$ atoms/cm$^3$ or less. An inorganic material, for example, is used for the first sealing film 51 and the second sealing film 52. At least one of silicon oxide, silicon oxynitride, silicon nitride, aluminum oxide (alumina), and tantalum oxide, for example, is used for the first sealing film 51 and the second sealing film 52.

The first sealing film 51 has compressive stress, and the second sealing film 52 has tensile stress. Alternatively, the first sealing film 51 has tensile stress, and the second sealing film 52 has compressive stress. Namely, the first sealing film 51 has one of compressive stress and tensile stress. The second sealing film 52 has the other of compressive stress and tensile stress.

For example, a composition (a compound, for example) used for the second sealing film 52 is substantially the same as a composition (a compound, for example) used for the first sealing film 51. For example, the first sealing film 51 and the second sealing film 52 contain substantially the same material. When using the same composition, the refractive indexes of these films are different from each other if stresses applied to these films are different.

The refractive index of the second sealing film 52 is different from the refractive index of the first sealing film 51. For example, the refractive index of the second sealing film 52 is lower than the refractive index of the first sealing film 51. When the refractive index of the second sealing film 52 is lower than the refractive index of the first sealing film 51, the second sealing film 52 has tensile stress, and the first sealing film 51 has compressive stress. Alternatively, the refractive index of the second sealing film 52 is higher than the refractive index of the first sealing film 51. When the refractive index of the second sealing film 52 is higher than the refractive index of the first sealing film 51, the second sealing film 52 has compressive stress, and the first sealing film 51 has tensile stress. In the following, the case will be described where the refractive index of the second sealing film 52 is lower than the refractive index of the first sealing film 51. The first sealing film 51 and the second sealing film 52 are an oxide containing Si. When the first sealing film 51 and the second sealing film 52 are an oxide containing Si, the refractive index of the first sealing film 51 is 1.46, for example, and the refractive index of the second sealing film 52 is 1.42, for example. The refractive indexes of the first sealing film 51 and the second sealing film 52 can be measured by ellipsometry, for example. A difference between the refractive indexes of the first sealing film 51 and the second sealing film 52 (a difference between compressive stress and tensile stress) can be implemented by changing the film forming conditions, for example.

The order of stacking the first sealing film 51 and the second sealing film 52 is not limited to the description recited above. Such a configuration may be possible in which the second sealing film 52 is provided on the common electrode 20 and the first sealing film 51 is stacked on the second sealing film 52. A plurality of compressive stress films are alternately stacked on a plurality of tensile stress films as described later.

Figure 2A:
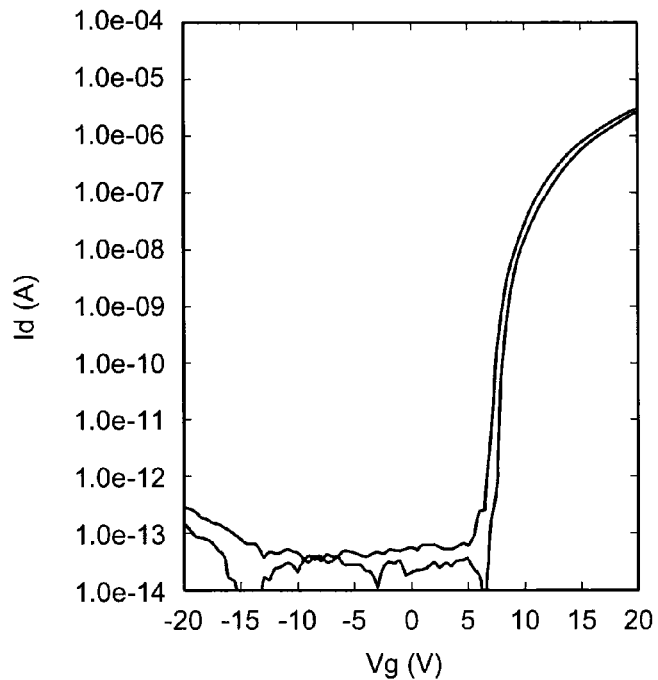
FIG. 2A and FIG. 2B are graphs illustrating the characteristics of a display device according to a reference sample.
Figure 2B:
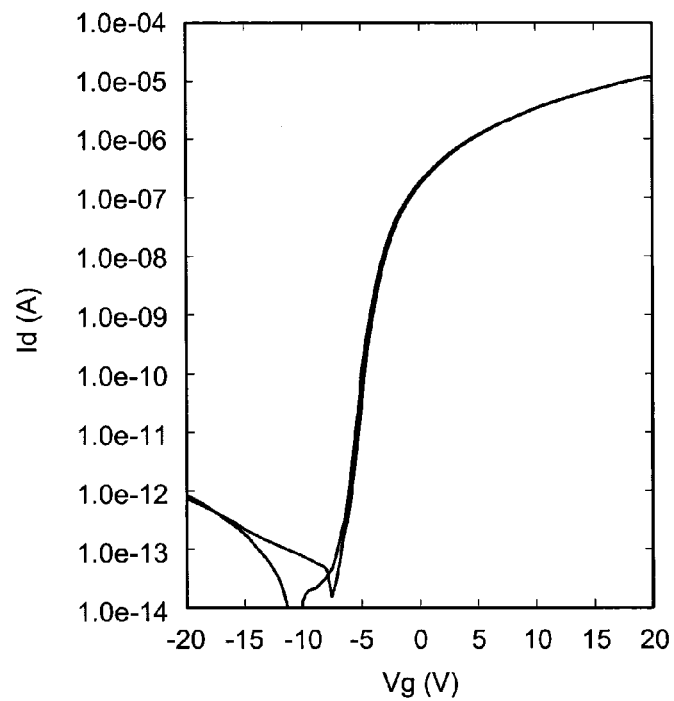

FIG. 2A and FIG. 2B are graphs illustrating the characteristics of a display device according to a reference sample.

FIG. 2A and FIG. 2B illustrate the characteristics of the display device according to the reference sample in which a sealing film having the hydrogen concentration higher than $10^{20}$ atom s/cm$^3$ is provided on a common electrode 20. The configuration of this display device is the same as the display device 110 except the hydrogen concentration included in the sealing film.

The horizontal axis in FIG. 2A and FIG. 2B expresses a gate voltage Vg (V) applied to the gate electrode 33 of the thin film transistor 12. The vertical axis expresses a current Id (A) passing across the first conducting portion 31 and the second conducting portion 32 of the thin film transistor 12 (a current passing across the drain and the source). FIG. 2A expresses the voltage-current characteristics before forming the sealing film. FIG. 2B expresses the voltage-current characteristics after forming the sealing film.

As shown in FIG. 2A, in the initial characteristics before forming the sealing film, excellent transistor characteristics are obtained. However, as shown in FIG. 2B, when the sealing film having the hydrogen concentration higher than $10^{20}$ atoms/cm$^3$ is formed, the threshold voltage of the thin film transistor 12 is reduced. Because of the reduction, in the reference sample, it is difficult to perform desired control, and the image quality of the display device is poor.

Figure 3A:
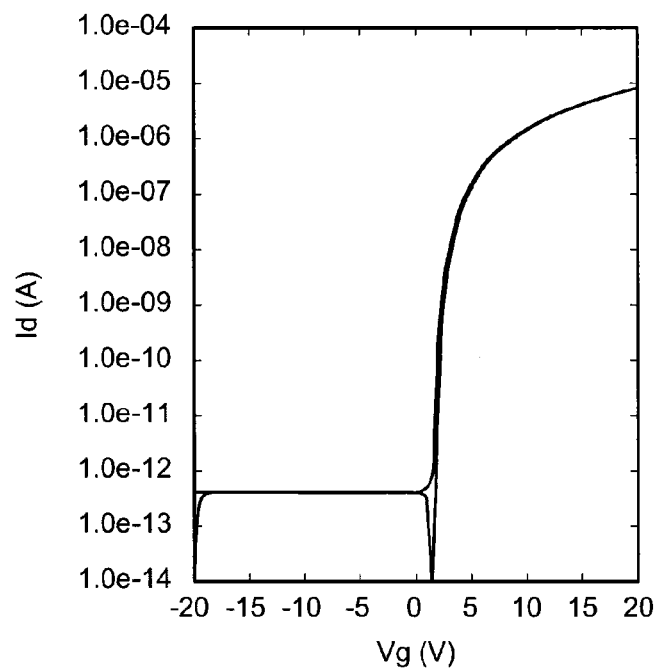
FIG. 3A and FIG. 3B are graphs illustrating the characteristics of the display device according to the first embodiment.
Figure 3B:
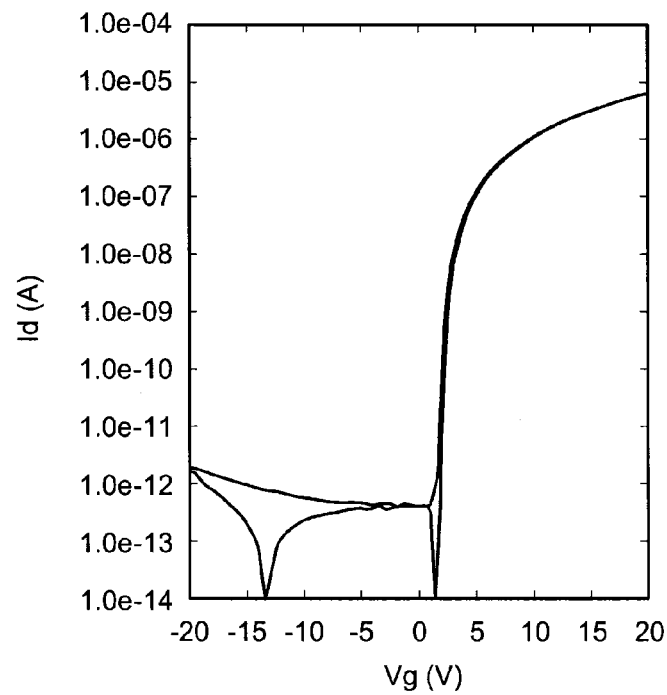

FIG. 3A and FIG. 3B are graphs illustrating the characteristics of the display device according to the first embodiment.

The horizontal axis in FIG. 3A and FIG. 3B expresses the gate voltage Vg, and the vertical axis expresses the current Id. FIG. 3A expresses the voltage-current characteristics before forming the sealing unit 22, and FIG. 3B expresses the voltage-current characteristics after forming the sealing unit 22.

As shown in FIG. 3A and FIG. 3B, in the display device 110 according to the embodiment, even after forming the sealing unit 22, the fluctuation of the threshold voltage of the thin film transistor 12 was not observed. In the display device 110, higher image quality can be obtained than in the conventional display device.

Figure 4:
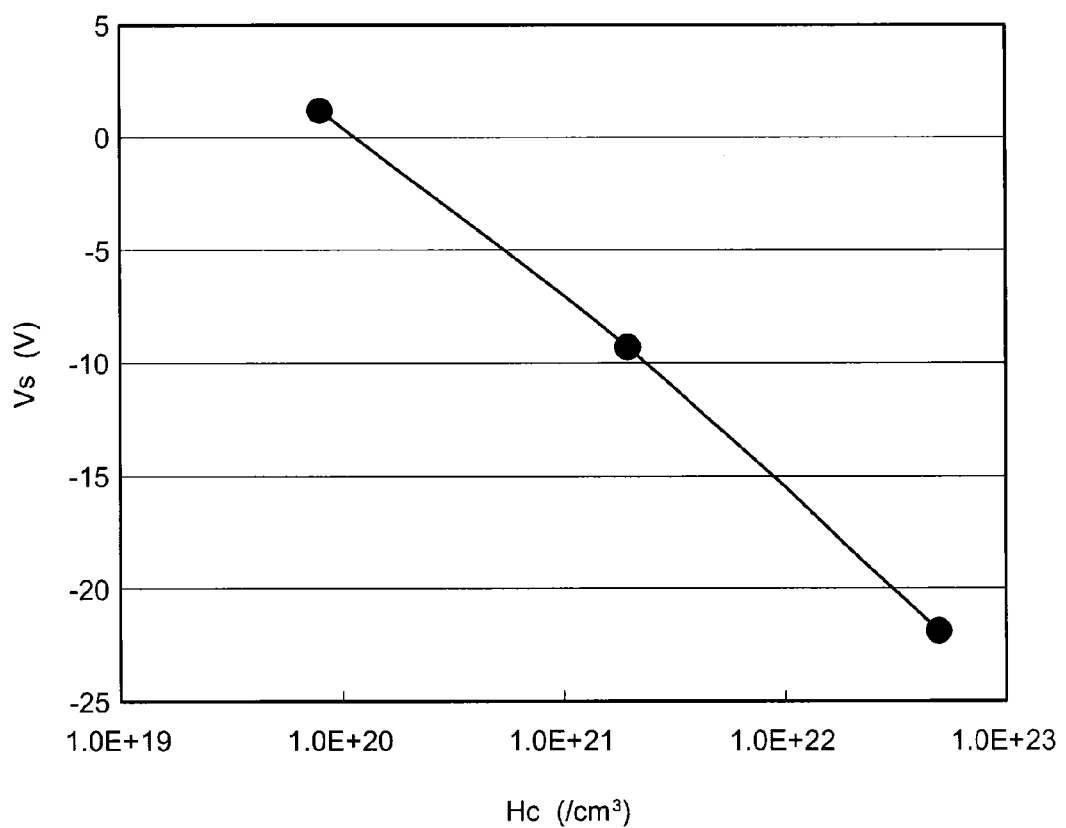
FIG. 4 is a graph illustrating the characteristics of a hydrogen concentration of a sealing unit.

FIG. 4 is a graph illustrating the characteristics of a hydrogen concentration of the sealing unit.

The horizontal axis in FIG. 4 expresses a hydrogen concentration Hc of the sealing unit 22. The vertical axis in FIG. 4 expresses a fluctuation value Vs (volt: V) of the threshold voltage of the thin film transistor 12 before and after forming the sealing unit 22.

As shown in FIG. 4, in the case where the concentration Hc is about $7\times10^{19}$ atoms/cm$^3$, the fluctuation value Vs is about +1 V. When the concentration Hc is $1.5\times10^{21}$ atoms/cm$^3$, the fluctuation value Vs is about −9V. When the concentration Hc is $0.6\times10^{22}$ atoms/cm$^3$, the fluctuation value Vs is about −22 V. When the concentration Hc is high, the fluctuation value Vs is shifted to the negative side, and the absolute value of the fluctuation value Vs is increased. When the concentration Hc is $1\times10^{20}$ atoms/cm$^3$, the fluctuation value Vs is substantially zero.

The inventor prepared thin film transistors in various configurations, and evaluated the fluctuation of the threshold voltage. As a result, the inventor found that the fluctuation of the threshold voltage is small in the configuration in which a sealing film having a hydrogen concentration of about $1\times10^{20}$ atoms/cm$^3$ or less is used. The inventor estimated from this result that the fluctuation of the threshold voltage of the thin film transistor 12 is caused by hydrogen contained in the sealing unit 22.

The sealing unit 22 including the first sealing film 51 and the second sealing film 52 having a hydrogen concentration of $1\times10^{20}$ atoms/cm$^3$ or less is provided to reduce the fluctuation of the threshold voltage of the thin film transistor 12. Preferably, the hydrogen concentration of the first sealing film 51 and the second sealing film 52 is $7\times10^{19}$ atoms/cm$^3$ or less. Thereby, the hydrogen concentration of the sealing film can be suppressed, and the fluctuation of the threshold voltage of the thin film transistor 12 can be suppressed, even in the case where various conditions in the manufacturing process steps are varied, for example.

It was revealed that at least one of a silicon oxide film, a silicon oxynitride film, a silicon nitride film, alumina, and a tantalum oxide film, which are excellent in stability, is used for the sealing film and the hydrogen concentration is made $10^{20}$ atoms/cm$^3$ or less in these films to stabilize the thin film transistor the characteristics.

A sealing film in this configuration is used to obtain excellent characteristics. However, for example, in the case where one layer (one type) of a sealing film is formed as the sealing film recited above, peeling occurs in an interface between the common electrode and the sealing film, or an interface between the pixel electrode and the common electrode, for example. It can be considered that this peeling is caused by a stress occurring in the sealing film.

Compressive stress or tensile stress remains in the sealing film depending on the process conditions in forming the sealing film. When stress remains in the sealing film, the peeling occurs in the configuration in which a sealing film having only one stress is formed, for example.

In the embodiment, a plurality of sealing films are formed on purpose. It was revealed that the stress type is varied in the sealing films to solve this problem. As described above, a stacked structure including the first sealing film 51 having one of compressive stress and tensile stress and the second sealing film 52 having the other of compressive stress and tensile stress is used as the sealing unit 22, thereby enabling the suppression of the adverse effect of stress occurring in the sealing unit 22 on the organic light emitting layer 18.

The stresses of the first sealing film 51 and the second sealing film 52 can be controlled by controlling at least one of a gas pressure, a partial pressure ratio, input power, substrate temperature, and a distance between a target and a substrate in forming the sealing film, for example.

It is considerably difficult to reduce the stress in a single sealing film in consideration of variations in the manufacturing conditions. On the contrary, a plurality of sealing films having different types of stresses is used to practically make variations smaller for facilitating the control of stress.

FIG. 5A to FIG. 5F are schematic cross-sectional views illustrating a method for manufacturing the display device according to the first embodiment.

Figure 5A:
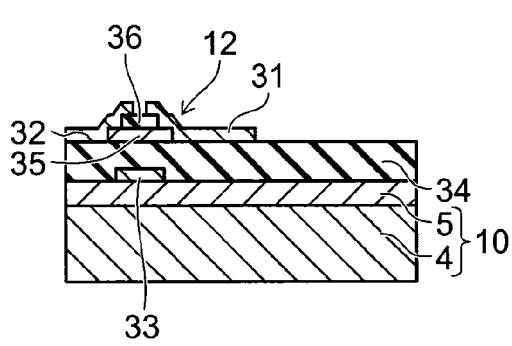
FIG. 5A to FIG. 5F are schematic cross-sectional views illustrating a method for manufacturing the display device according to the first embodiment.

As shown in FIG. 5A, in the manufacture of the display device 110, the thin film transistor 12 is formed on the major surface 10a of the substrate 10. In forming the thin film transistor 12, the gate electrode 33 is formed on the major surface 10a. The gate insulating film 34 is formed on the major surface 10a and the gate electrode 33. The semiconductor film 35 is formed on the gate insulating film 34. The channel protection film 36 is formed on the semiconductor film 35. The first conducting portion 31 and the second conducting portion 32 are formed on the gate insulating film 34, the semiconductor film 35, and the channel protection film 36.

Figure 5D:
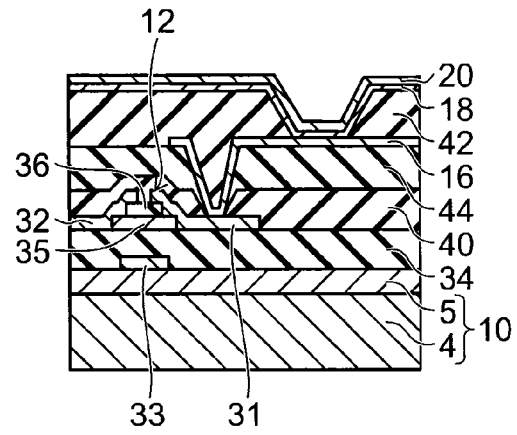
Figure 5B:
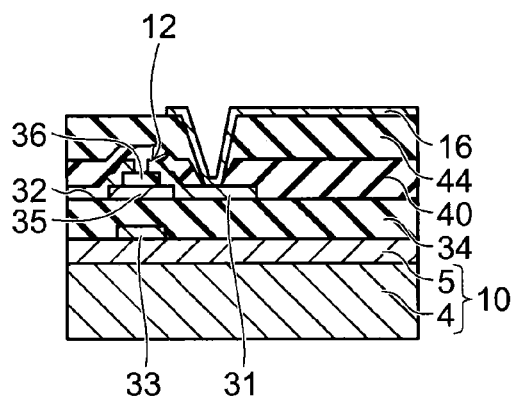

As shown in FIG. 5B, the passivation film 40 is formed on the thin film transistor 12. For example, a SiO$_2$ film to be the passivation film 40 is formed by PE-CVD (Plasma-Enhanced Chemical Vapor Deposition). The opening 40a is formed in the SiO$_2$ film. Thus, the passivation film 40 is obtained. The thickness of the passivation film 40 is 200 nm (100 nm or more 300 m or less), for example.

The color filter 44 is formed on the passivation film 40. For example, one of red, green, and blue color resin films (a color resist, for example) is applied. The color resin film is patterned, and the opening 44a is formed. Thus, the color filter 44 is obtained. The thickness of the color filter 44 is 2 μm, for example (1 μm or more and 3 m or less, for example).

The pixel electrode 16 is formed on the color filter 44. For example, an ITO film to be the pixel electrode 16 is formed by sputtering or the like, and patterned in a predetermined shape to obtain the pixel electrode 16. The thickness of the pixel electrode 16 is 60 nm (30 nm or more and 200 nm or less), for example.

Figure 5E:
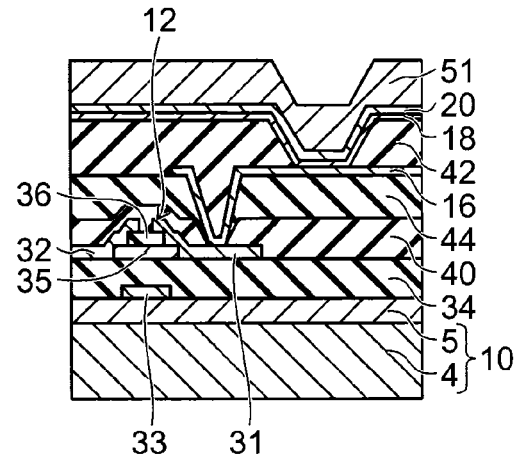
Figure 5C:
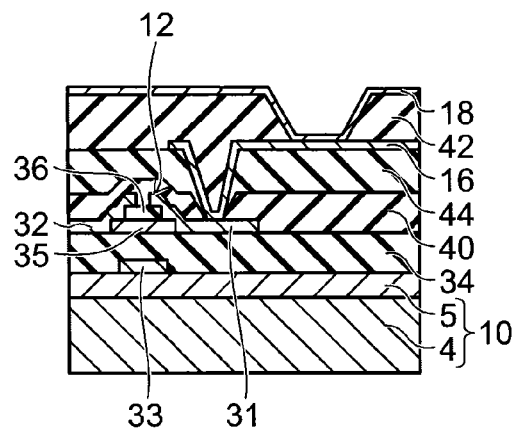

As shown in FIG. 5C, the planarization film 42 is formed on the pixel electrode 16 and the color filter 44. For example, an organic resin to be the planarization film 42 is applied and patterned to obtain the planarization film 42. The organic light emitting layer 18 is formed on the planarization film 42 and the non-opposing region 16b of the pixel electrode 16. The organic light emitting layer 18 is formed by vapor deposition, for example.

As shown in FIG. 5D, the common electrode 20 is formed on the organic light emitting layer 18. A LiF film is stacked on an Al film to obtain the common electrode 20, for example. Vapor deposition, for example, is used for forming the common electrode 20.

As shown in FIG. 5E, the first sealing film 51 is formed on the common electrode 20. At least one of a silicon oxide film, a silicon oxynitride film, a silicon nitride film, alumina, and a tantalum oxide film, for example, to be the first sealing film 51 is formed by sputtering, for example, to obtain the first sealing film 51. A gas pressure in forming the first sealing film 51 is about a pressure of 0.5 Pa, for example, (a pressure of 0.1 Pa or more and less than a pressure of 2.0 Pa, for example).

Figure 5F:
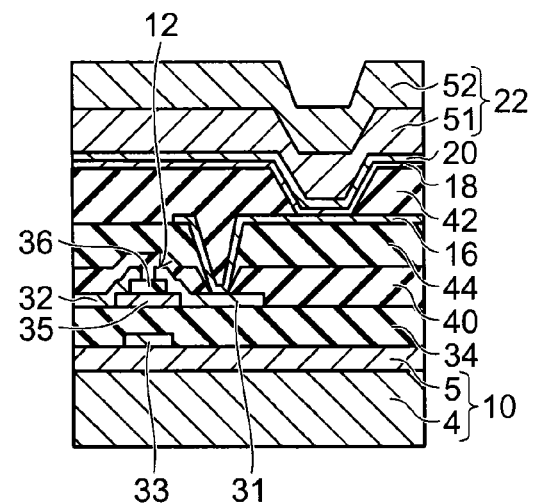

As shown in FIG. 5F, the second sealing film 52 is formed on the first sealing film 51. At least one of a silicon oxide film, a silicon oxynitride film, a silicon nitride film, alumina, and a tantalum oxide film, for example, to be the second sealing film 52 is formed by sputtering, for example, to obtain the second sealing film 52. A gas pressure in forming the second sealing film 52 is about a pressure of 3.0 Pa, for example (a pressure of 2.0 Pa or more and a pressure of 10.0 Pa or less, for example). Thus, the sealing unit 22 is formed on the common electrode 20. As described above, the display device 110 is fabricated. As described above, a gas pressure in forming the second sealing film 52 is made higher than a gas pressure in forming the first sealing film 51, thereby enabling tensile stress to be generated in the second sealing film 52.

Figure 6:
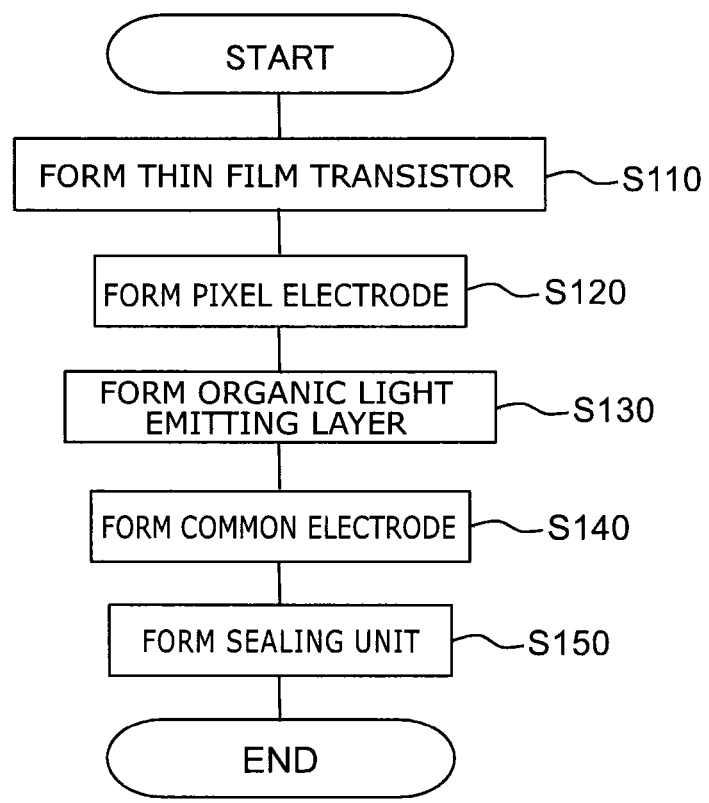
FIG. 6 is a flowchart illustrating a method for manufacturing the display device according to the first embodiment.

FIG. 6 is a flowchart illustrating a method for manufacturing the display device according to the first embodiment.

As shown in FIG. 6, the method for manufacturing the display device 110 includes Step S110 of forming the thin film transistor 12, Step S120 of forming the pixel electrode 16, Step S130 of forming the organic light emitting layer 18, Step S140 of forming the common electrode 20, and Step S150 of forming the sealing unit 22.

In Step S110, the process described with reference to FIG. 5A is performed, for example. In Step S120, the process described with reference to FIG. 5B is performed, for example. In Step S130, the process described with reference to FIG. 5C is performed, for example. In Step S140, the process described with reference to FIG. 5D is performed, for example. In Step S150, the processes described with reference to FIG. 5E and FIG. 5F are performed, for example.

Figure 7:
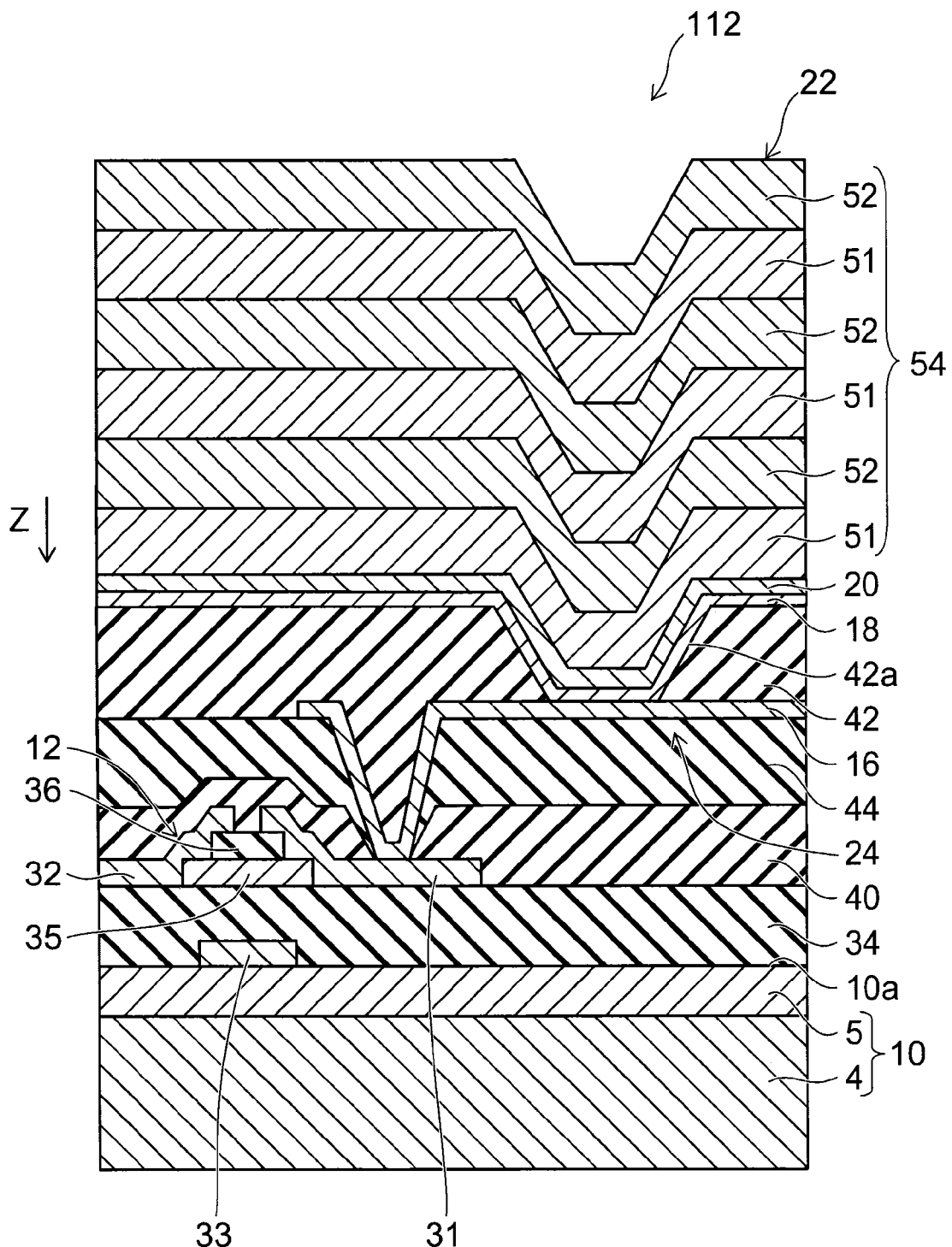
FIG. 7 is a schematic cross-sectional view illustrating the configuration of another display device according to the first embodiment.

FIG. 7 is a schematic cross-sectional view illustrating the configuration of another display device according to the first embodiment.

As shown in FIG. 7, a sealing unit 22 of a display device 112 includes a stacked film 54.

The stacked film 54 includes a plurality of first sealing films 51 and a plurality of second sealing films 52. The first sealing films 51 and the second sealing films 52 are alternately stacked on each other in the Z-axis direction.

Also in the display device 112 including the stacked film 54 in the sealing unit 22, the hydrogen concentration of the first sealing film 51 and the second sealing film 52 is $10^{20}$ atoms/cm$^3$ or less, thereby enabling the suppression of the fluctuation of the threshold voltage of the thin film transistor 12 to improve the image quality of the display device 112.

The barrier properties of the sealing unit 22 to the organic light emitting layer 18 can be enhanced by using the stacked film 54 as the sealing unit 22. In the stacked film 54, the balance of the compressive stress included in the first sealing film 51 and the tensile stress included in the second sealing film 52 is made more uniform. Thereby, the adverse effect of the stress included in the sealing unit 22 on the organic light emitting layer 18 can be more appropriate suppressed.

Second Embodiment

Figure 8:
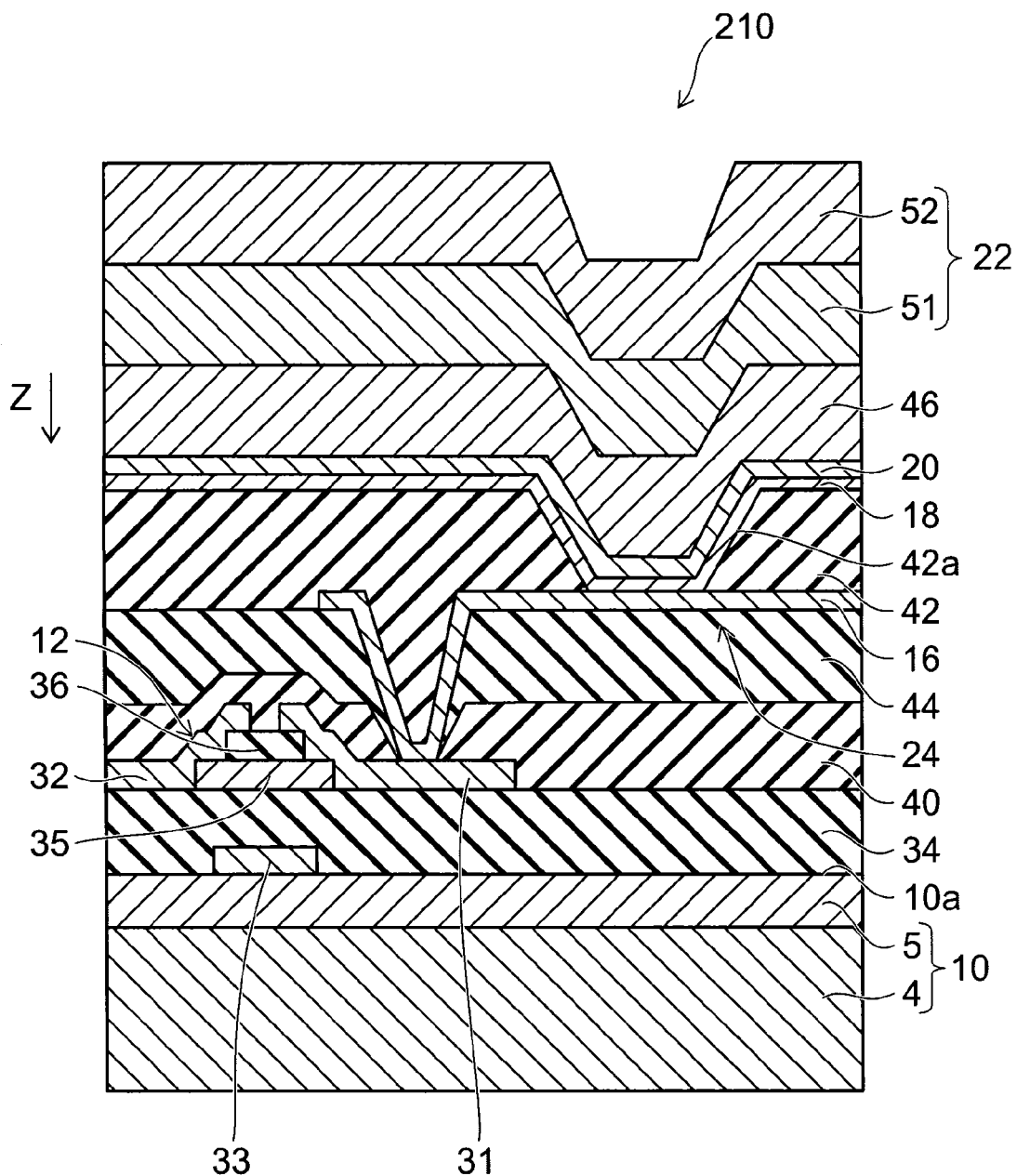
FIG. 8 is a schematic view illustrating the configuration of a display device according to a second embodiment.

FIG. 8 is a schematic view illustrating the configuration of a display device according to a second embodiment.

As shown in FIG. 8, a display device 210 includes an organic barrier layer 46 between a common electrode 20 and a sealing unit 22. The organic barrier layer 46 is an organic film containing at least polyparaxylene, for example. The configuration of the display device 210 is the same as the configuration of the display device 110 except that the organic barrier layer 46 is provided.

The organic barrier layer 46 protects an organic light emitting layer 18 from oxygen plasma used when forming a first sealing film 51 and a second sealing film 52 that are inorganic films. Thereby, a damage on the organic light emitting layer 18 can be suppressed. The organic barrier layer 46 is provided to form a conformal film in the sealing unit 22. For example, the organic barrier layer 46 fills a defect such as a pin hole. Thereby, the barrier performance of the sealing unit 22 and the organic barrier layer 46 can be improved. The coverage of the organic barrier layer 46 can be made higher than the coverage of the first sealing film 51 and the second sealing film 52. Thereby, a much higher barrier performance can be obtained.

Figure 9A:
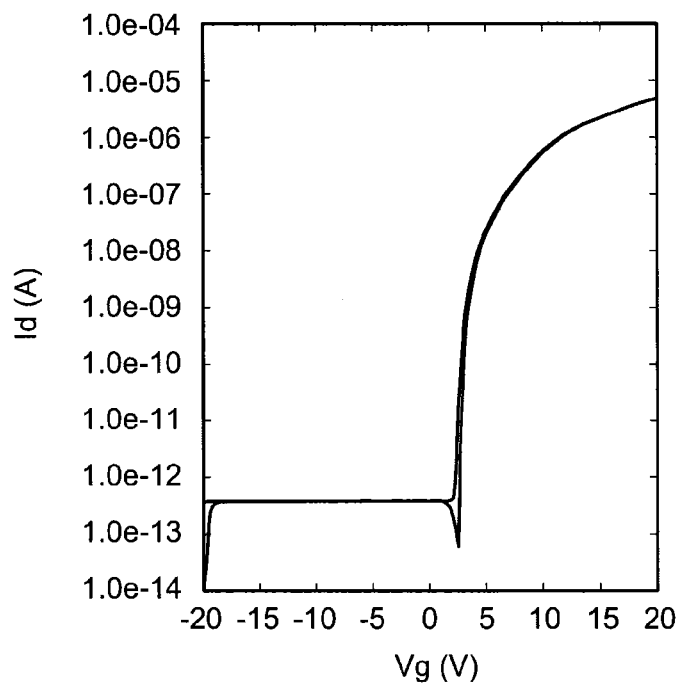
FIG. 9A and FIG. 9B are graphs illustrating the characteristics of the display device according to the second embodiment.
Figure 9B:
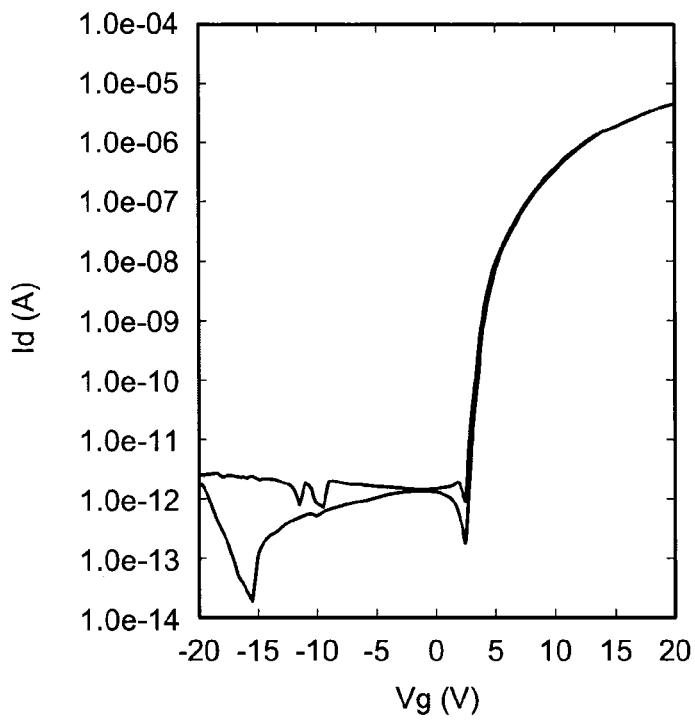

FIG. 9A and FIG. 9B are graphs illustrating the characteristics of the display device according to the second embodiment.

The horizontal axis in FIG. 9A and FIG. 9B expresses the gate voltage Vg, and the vertical axis expresses the current Id. FIG. 9A and FIG. 9B express the voltage-current characteristics before and after forming the sealing unit 22 and the organic barrier layer 46, respectively.

FIG. 9A and as shown in FIG. 9B, in the display device 210 according to the embodiment, fluctuations are not observed in the threshold voltage of a thin film transistor 12 after forming the sealing unit 22 and the organic barrier layer 46. As described above, also in the display device 210 provided with the organic barrier layer 46, the fluctuation of the threshold voltage of the thin film transistor 12 can be suppressed, and the image quality can be improved.

Figure 10A:
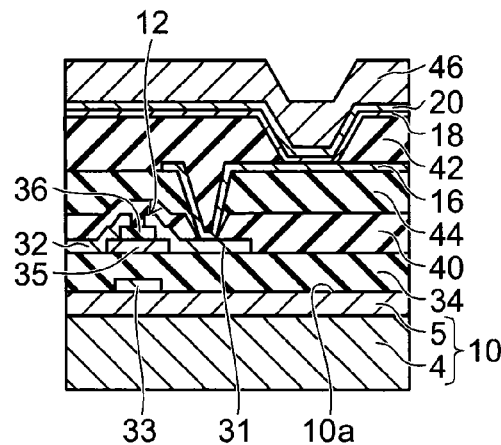
FIG. 10A to FIG. 10C are schematic cross-sectional views illustrating a method for manufacturing the display device according to the second embodiment.
Figure 10B:
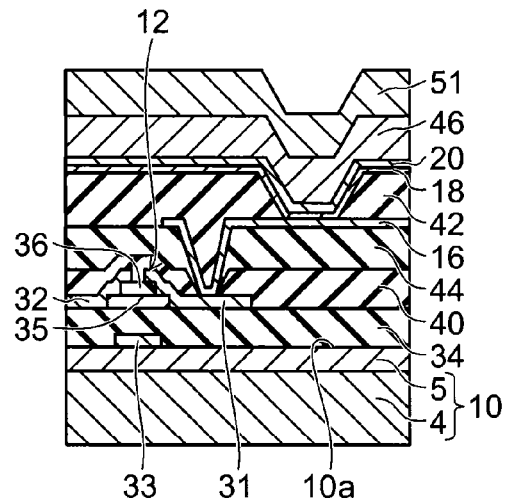
Figure 10C:
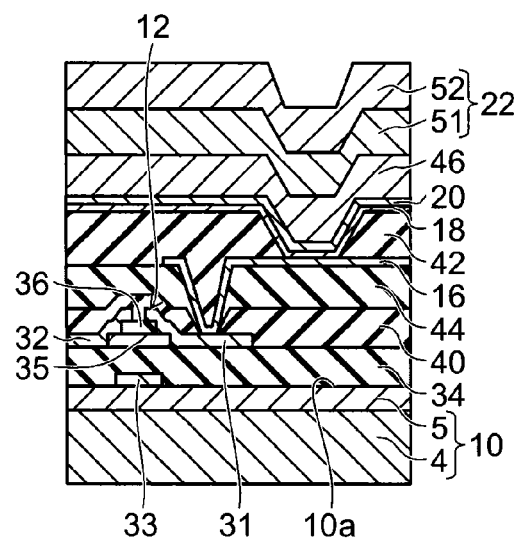

FIG. 10A to FIG. 10C are schematic cross-sectional views illustrating a method for manufacturing the display device according to the second embodiment.

In the method for manufacturing the display device 210, since the procedures from the start to forming the common electrode 20 are substantially the same as the procedures of the display device 110, a description is omitted As shown in FIG. 10A, the organic barrier layer 46 is formed on the common electrode 20. The organic barrier layer 46 is formed by thermal CVD (Chemical Vapor Deposition), for example.

As shown in FIG. 10B, the first sealing film 51 is formed on the organic barrier layer 46. As described in the display device 110, the first sealing film 51 is formed by sputtering. A gas pressure in forming the first sealing film 51 is about a pressure of 0.5 Pa, for example (a pressure of 0.1 Pa or more and less than a pressure of 2.0 Pa, for example).

As shown in FIG. 10C, the second sealing film 52 is formed on the first sealing film 51. As described in the display device 110, the second sealing film 52 is formed by sputtering. A gas pressure in forming the second sealing film 52 is about a pressure of 3.0 Pa (a pressure of 2.0 Pa or more and less than a pressure of 10.0 Pa, for example). Thus, the sealing unit 22 is formed on the organic barrier layer 46. As described above, the display device 210 is fabricated.

In the description recited above in the embodiment, the lower surface emitting display device is described. However, in the embodiment, the display device may be a top surface emission type.

According to the embodiment, a display device with a high image quality can be provided.

In the specification of the application, a state in which "a component is provided on another component" includes a state in which a component is directly provided on another component as well as a state in which a component is provided on another component with a different element inserted between the component and another component. A state in which "a component is stacked on another component" includes a state in which a component is stacked on another component to contact each other as well as a state in which a component is stacked on another component with a different element inserted between the component and another component. A state in which "a component opposes another component" includes a state in which a component directly faces another component as well as a state in which a component faces another component with a different element inserted between the component and another component.

As described above, the embodiments of the invention are described with reference to specific examples.

However, the embodiments of the invention are not limited to these specific examples. For example, the specific configurations of the components such as the substrate, the thin film transistor, the pixel electrode, the organic light emitting layer, the common electrode, the sealing unit, the first sealing film, the second sealing film, the organic barrier layer, and the stacked film included in the display device are incorporated in the scope of the invention as long as a person skilled in the art appropriately selects components from the publicly known range to similarly implement the invention for obtaining the similar effect.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A display device, comprising:
   a substrate;
   a thin film transistor provided on the substrate, the thin film transistor including:
      a gate electrode provided on the substrate;
      a gate insulating film provided on the gate electrode;
      a semiconductor film provided on the gate insulating film, the semiconductor film including an oxide semiconductor containing at least one of In, Ga, and Zn;
      a first conducting portion electrically connected to the semiconductor film; and
      a second conducting portion electrically connected to the semiconductor film and provided apart from the first conducting portion;
   a pixel electrode electrically connected to one of the first conducting portion and the second conducting portion;
   an organic light emitting layer provided on the pixel electrode;
   a common electrode provided on the organic light emitting layer; and
   a sealing unit provided on the common electrode, the sealing unit including:
      a first sealing film having a hydrogen concentration of $10^{20}$ atoms/cm$^3$ or less; and
      a second sealing film stacked on the first sealing film and having a hydrogen concentration of $10^{20}$ atoms/cm$^3$ or less,
      a refractive index of the second sealing film being different from a refractive index of the first sealing film.

2. The device according to claim 1, wherein
   the first sealing film has one of compressive stress and tensile stress, and
   the second sealing film has the other of compressive stress and tensile stress.

3. The device according to claim 1, further comprising an organic barrier layer provided between the common electrode and the sealing unit and containing at least polyparaxylene.

4. The device according to claim 1, wherein
   the sealing unit includes a plurality of the first sealing films and a plurality of the second sealing films, and the plurality of the first sealing films and the plurality of the second sealing films are alternately stacked on each other.

5. The device according to claim 1, wherein the first sealing film and the second sealing film contain at least one of silicon oxide, silicon oxynitride, silicon nitride, aluminum oxide, and tantalum oxide.

6. The device according to claim 1, wherein the first sealing film and the second sealing film contain same material.

7. The device according to claim 1, wherein a thickness of the semiconductor film is 5 nm or more and 50 nm or less.

8. The device according to claim 1, wherein
   a hydrogen concentration of the first sealing film is $7\times10^{19}$ atoms/cm$^3$ or less, and
   a hydrogen concentration of the second sealing film is $7\times10^{19}$ atoms/cm$^3$ or less.

9. The device according to claim 1, wherein the common electrode extends on the semiconductor film.

10. The device according to claim 1, wherein the substrate is flexible.

11. The device according to claim 1, wherein
    the semiconductor film has a first region covered with the first conducting portion, a second region covered with the second conducting portion, and a third region not covered with the first conducting portion and the second conducting portion, and
    the gate electrode opposes the third region with the gate insulating film sandwiched between the gate electrode and the third region.

12. The device according to claim 11, wherein the thin film transistor further includes a channel protection film provided at least on the third region.

13. The device according to claim 12, wherein the channel protection film includes a silicon oxide film.

14. The device according to claim 1, wherein the pixel electrode contains at least one of ITO, IZO, AZO, IGZO, and ZnO.

15. The device according to claim 1, wherein a thickness of the pixel electrode is 30 nm or more and 200 nm or less.

16. The device according to claim 1, further comprising an insulative and light transmissive passivation film provided between the thin film transistor and the pixel electrode,
    the passivation film having a first opening, a part of the first conducting portion being exposed from the first opening,
    the pixel electrode contacting the part of the first conducting portion in the first opening.

17. The device according to claim 1, further comprising a planarization film provided between the pixel electrode and the organic light emitting layer,
    the pixel electrode including
       an opposing region opposing the thin film transistor, and
       a non-opposing region not opposing the thin film transistor,
    the planarization film having a second opening, a part of the non-opposing region being exposed from the second opening,
    the organic light emitting layer contacting the part of the non-opposing region in the second opening.

18. The device according to claim 1, wherein the common electrode includes a metal material.

19. The device according to claim 18, wherein the common electrode contains at least one of Al and MgAg.

* * * * *